(12) United States Patent
Kimmel et al.

(10) Patent No.: US 6,490,546 B1
(45) Date of Patent: Dec. 3, 2002

(54) METHOD FOR OBTAINING DC CONVERGENCE FOR SOI FET MODELS IN A CIRCUIT SIMULATION PROGRAM

(75) Inventors: Richard Kimmel, Wappingers Falls, NY (US); Lawrence F. Wagner, Jr., Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/304,611

(22) Filed: May 4, 1999

(51) Int. Cl.[7] ................ G06F 17/50; H01L 31/0392; G06G 7/48; G06G 7/56
(52) U.S. Cl. ................ 703/14; 703/4; 703/5
(58) Field of Search ............ 703/14, 4, 5; 257/347–348

(56) References Cited

U.S. PATENT DOCUMENTS

| | | | | |
|---|---|---|---|---|
| 5,770,881 A | * | 6/1998 | Pelella et al. | 257/347 |
| 5,774,411 A | * | 6/1998 | Hsieh et al. | 365/230.06 |
| 5,963,724 A | * | 10/1999 | Mantooth et al. | 703/14 |
| 6,023,577 A | * | 2/2000 | Smith et al. | 703/14 |

OTHER PUBLICATIONS

Sinitsky et al.; "Simulation of SOI devices and circuits using BSIM3SOI"; Elect. Dev. Lett.; pp. 323–325; Sep. 1998.*
Matloubian et al.; "Modeling of the subthreshold characteristics of SOI MOSFET's with floating body"; IEEE Trans. Elect. Dev.; pp. 1985–1994; Sep. 1990.*
Gautier et al.; "On the transient operation of partially depleted SOI NMOSFET's"; IEEE Elect. Dev. Lett.; pp. 497–499; Nov. 1995.*
Jenkins et al.; "Characteristics of SOI FET's under pulsed conditions"; IEEE Trans. Elect. Dev.; pp. 1923–1930; Nov. 1997.*
Spencer et al.; "Process and device simulation in designing thin film CMOS/SOI technology"; 1991 SOI Conf.; pp. 82–83; Oct. 1991.*
Gautier et al.; "Transient effects in floating body SOI NMOSFETs"; 1995 SOI Conf.; pp. 112–113; Oct. 1995.*
Wei et al.; "Design methodology for minimizing hysteretic V–sub T variation in partially–depleted SOI CMOS"; 1997 Elect. Dev. Meeting; pp. 411–414; Dec. 1997.*

(List continued on next page.)

Primary Examiner—Hugh M. Jones
(74) Attorney, Agent, or Firm—Ratner & Prestia; Tiffany L. Townsend, Esq.

(57) ABSTRACT

A process for obtaining accurate DC convergence in a DC phase of a circuit simulation program for models of field effect transistors (FETs) on a silicon-on-insulator (SOI) substrate. The process comprises running iterations of the DC phase of the circuit simulation program such that error criteria are satisfied, wherein the pseudo-time step changes at each iteration until it reaches a value such that a desired current value is achieved. DC convergence is also achieved by reducing the magnitude of the capacitive and/or charge elements connected to the floating body regions of the field effect transistors on the silicon-on-insulator substrate model during the DC phase to achieve a desired current value.

15 Claims, 5 Drawing Sheets

OTHER PUBLICATIONS

Assaderaghi et al.; "Accurate measurement of pass–transistor leakage current in SOI MOSFETs"; 1996 IEEE SOI Conf.; pp. 66–67; Sep. 1996.*

Chuang et al.; "Dual–mode parasitic bipolar effect in dynamic CVSL XOR circuit with floating–body partially–depleted SOI devices"; 1997 Int. Symp. VLSI Teach, Systems & Appl.; pp. 288–292; Jun. 1997.*

Lu et al.; "Floating–body effects in partially depleted SOI CMOS circuits"; IEEE J. Solid–State Circuits; pp. 1241–1253; Aug. 1997.*

Dongwook et al.; "A physical charge–based model for non–fully depleted SOI MOSFET's and its use in assessing floating–body effects in SOI CMOS circuits"; IEEE Trans. Elect. Dev.; pp. 728–737; Apr. 1995.*

Workman et al.; "Physical modeling of temperature dependences of SOI CMOS devices and circuits including self–heating"; IEEE Trans. Elect. Dev.; pp. 125–133; Jan. 1998.*

Wei et al.; "Effect of floating–body charge on SOI MOSFET design"; IEEE Trans. Elect. Dev.; pp. 430–438; Feb. 1998.*

Wei et al., "Bounding the severity of hysteretic transient effects in partially– depleted SOI CMOS"; 1996 IEEE SOI Conf.; pp. 74–75; Sep. 1996.*

J. Keinert et al., "The Projection Method: An Algorithm to Improve Convergence of the Newton–Raphson Iteration and Its Application on Circuit Simulation," TR 05.421, IBM Laboratory Boeblingen, Nov. 20, 1987.

* cited by examiner

METHOD FOR OBTAINING DC CONVERGENCE FOR SOI FET MODELS IN A CIRCUIT SIMULATION PROGRAM

TECHNICAL FIELD

The present invention relates generally to a circuit simulation program and, more specifically, to a method for obtaining DC convergence for silicon-on-insulator (SOI) field effect transistors (FETs) models in the steady state DC phase of a circuit simulation program.

BACKGROUND OF THE INVENTION

Circuit simulation programs make use of device models to simulate single devices or large circuits consisting of many devices. These circuit simulation programs use standard numerical methods to solve an underlying system of equations (e.g. algebraic).

A typical circuit simulation consists of several phases. Usually in the first phase a steady state DC analysis is performed to compute the initial operating point (e.g. currents, voltages, charges) for each of the circuit elements. When the circuit simulation program successfully completes the DC analysis, it is said to have achieved "DC convergence." A second phase, known as the transient analysis phase, is often conducted to compute the changes in the circuit currents and voltages as a function of time. Alternatively, the second phase might be a frequency analysis phase which computes the frequency dependence of the circuit. In some cases, the desired information is obtained from the DC analysis, in which case a second phase is not needed.

Circuit simulation programs use iterative methods for solving the circuit equations. For example, in the steady state DC phase (hereinafter "DC phase") of the analysis, the program starts by assuming an initial operating point for all the circuit elements. That is, an initial set of voltages, currents, and charges is chosen. The program then allows a small amount of time to pass and calculates the changes in the operating point for all the circuit elements. The amount of time is called the "pseudo-time step." The qualifier "pseudo" is used since during a DC analysis the "real" time has not changed. In this discussion, we will use the phrase "time step" with the understanding that it refers to a "pseudo-time step" during a DC analysis. The program then uses the previous result to choose a new operating point and time step, and repeats the calculations. Each repeat of the calculations is called an "iteration."

After each iteration, the changes in the voltages, currents, and charges are compared to an error criteria. If any of these changes are greater than the error criteria, the program continues with another iteration. If all of these changes are less than the error criteria then the program stops. At this point, when all of the error criteria are met, "DC convergence" is achieved. All of the voltages, currents, and charges have reached their steady state, DC values. If the program continues without ever meeting the error criteria, or stops for any other reason, then there is a failure to achieve DC convergence.

During a second transient analysis phase, the program proceeds in a similar manner except that "real-time" steps are used instead of "pseudo-time" steps. Circuit analysis programs are controlled by an input dataset, also known as a source or a netlist, and typically consist of at least three main components or sections. In the AS/X and PowerSPICE circuit simulation programs, the three components are the model description, execution controls, and outputs.

The description of the circuit and the details of the circuit models are given in the model description section. The execution controls section contains instructions that specify the analysis phases to be run, and the run controls which specify how the analysis is to be carried out. The outputs section specifies the information to be returned from the program.

A device model consists of a set of circuit elements which stimulate the operation of a device, such as a field effect transistor (FET). The basic components of an FET, as illustrated in FIGS. 1 and 2, include a source 10, drain 12, gate 14, and body region 16. The substrate 1 is made of those materials conventionally used, such as silicon, and often contains a doped well region containing the source, drain and body regions of the FET. An optional oxide region 30 provides lateral electrical isolation of the device.

The voltages of the source, drain, gate, and body regions determine the currents which flow through the FET. As a result, it is important to accurately model and simulate these voltages.

The FET in FIG. 1 is illustrative of a "bulk" device in which the substrate or well region 1 is either electrically grounded or connected to a fixed power supply voltage. For this FET, the body region 16 is contiguous with substrate or well region 1. Thus, the electrical ground or power supply connection provides a stable, known voltage for the body region 16. As a result, circuit simulation programs do not have a problem solving for the operating point associated with the body region of these bulk FETs.

Recently, it has become desirable to use FETs formed on a silicon-on-insulator (SOI) substrate, an example of which is illustrated in FIG. 2. SOI substrates have an oxide layer 18, which is an electrical insulator, separating body region 16 from substrate 1. As a result, the body region of the SOI FET is not electrically connected to a stable ground or power supply voltage. In this case, the body region is often referred to as a "floating body" region. The voltage of this floating body region is sensitive to small DC leakage currents which enter or leave from the source and the drain to the floating body region, and is also sensitive to small capacitive currents between the floating body region and the source, drain, gate, and substrate. The sensitivity of the floating body region creates difficulty in achieving DC convergence in circuit simulation programs, or if convergence is achieved, the resulting solution is often incorrect. This problem is exacerbated with circuits containing many SOI FETs, the design of which is becoming increasingly common.

The deficiencies of the use of conventional circuit simulation programs show that a need exists for obtaining accurate DC convergence in the DC phase for SOI FET models. To overcome the shortcomings of conventional methods, a new process is provided. An object of the present invention is to provide a method of obtaining accurate DC convergence in the DC phase for SOI FET models in a circuit simulation program.

SUMMARY OF THE INVENTION

To achieve these and other objects, and in view of its purposes, the present invention provides a method for obtaining an accurate DC convergence in the DC phase of a circuit simulation program for field effect transistors (FETs) of a silicon-on-insulator (SOI) substrate.

The method of the invention comprises setting a desired current value and running the steady state phase of a circuit simulation program, simulating circuits containing models of silicon-on-insulator (SOI) field effect transistors (FETs), and requiring that iterations continue until the error criteria are met, and also requiring that iterations continue until the size of the pseudo-time step has increased to a value such that the desired current value is achieved. Both of these conditions are required to achieve DC convergence. The large final value of the pseudo-time step helps the simulator achieve DC convergence, and in addition, assures that a correct solution is found.

Preferably, the size of the pseudo-time step in the DC phase of the simulation is controlled by modifying an algorithm in the circuit analysis program so that the size of the pseudo-time step changes with each iteration until it reaches a sufficiently large value such that the desired current value is achieved. The size of the large value is preferably specified by a run control in the circuit simulation program.

In a second embodiment of the invention, a desired current value is selected and the values for the capacitive and/or charge elements in the field effect transistors (FET) on a silicon-on-insulator (SOI) substrate model are reduced during the steady state DC analysis to achieve the desired current value. At the end of the DC analysis the capacitive and charge elements are restored to their original correct values. Reducing the capacitive and charge values assists the circuit simulation program in achieving an accurate DC convergence by reducing the small capacitive or charge element currents into or out of the floating body regions, so that the small DC currents from the source and drain to the floating body regions determine the floating body voltages.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The invention will next be illustrated with reference to the figures in which similar numbers indicate the same elements in all figures. Such figures are intended to be illustrative, rather than limiting, and are included to facilitate the explanation of the apparatus of the present invention.

Several circuit simulation programs are currently used to design and analyze integrated circuits. Two popular programs include PowerSPICE and AS/X. These circuit simulation programs analyze circuits using models which can be manipulated, such as by varying parameters or setting run controls. J. Keinert, H. Spiro, and J. Wilczynski describe methods of altering algorithms in their report entitled, "The Projection Method: An Algorithm to Improve Convergence of the Newton-Raphson Iteration and Its Application on Circuit Simulation." TR 05.421, IBM Laboratory Boeblingen, Nov. 20, 1987, the contents of which are incorporated by reference.

Typical circuit simulation programs, such as the PowerSPICE and AS/X circuit simulators developed by IBM, analyze circuits in several phases. The first phase, known as the DC analysis or DC phase, computes initial conditions for the circuit. Typically, the circuit simulator will continue in the DC analysis phase until error criteria, which control the change in voltage or charge, are reduced below a specified minimum. When this condition is reached, DC convergence is achieved and the program either stops or moves into a second phase, such as a transient or frequency analysis phase.

As discussed above, circuit simulation programs have trouble achieving DC convergence or, if convergence is achieved, incorrect floating body voltages are sometimes obtained when using FET models on an SOI substrate. The main reason for incorrect convergence or nonconvergence during the DC phase is that the capacitive and charge element currents incorrectly dominate the small DC currents in the model, even though these currents should be zero during DC analysis. The problem occurs as a result of a small magnitude of DC currents into and out of the floating body region, for instance.

Figure 1:
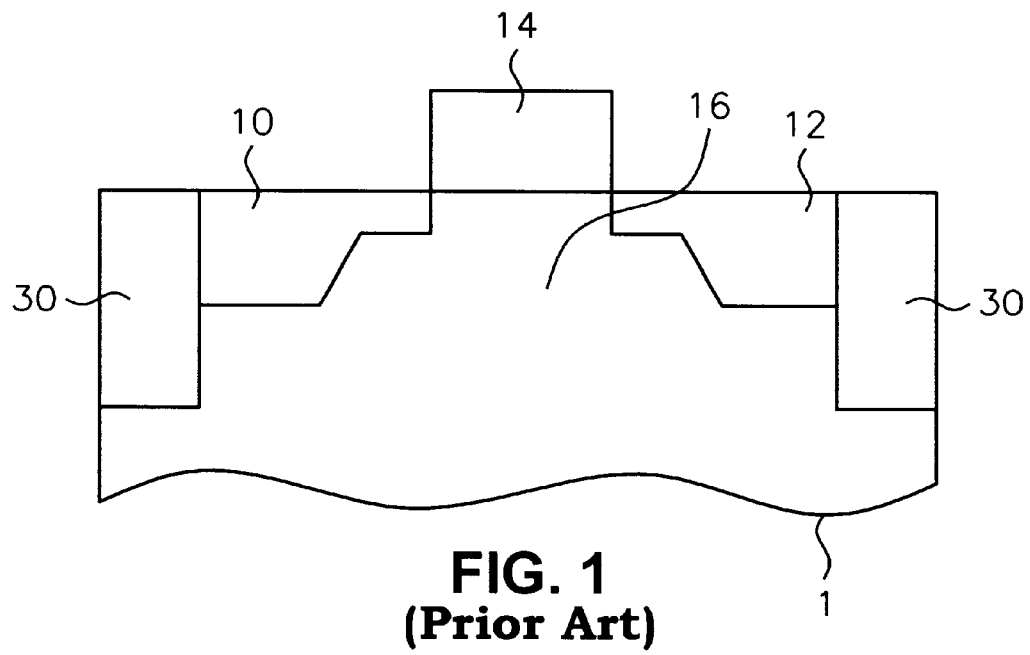
FIG. 1 shows in schematic representation a field effect transistor (FET) in a substrate.
Figure 2:
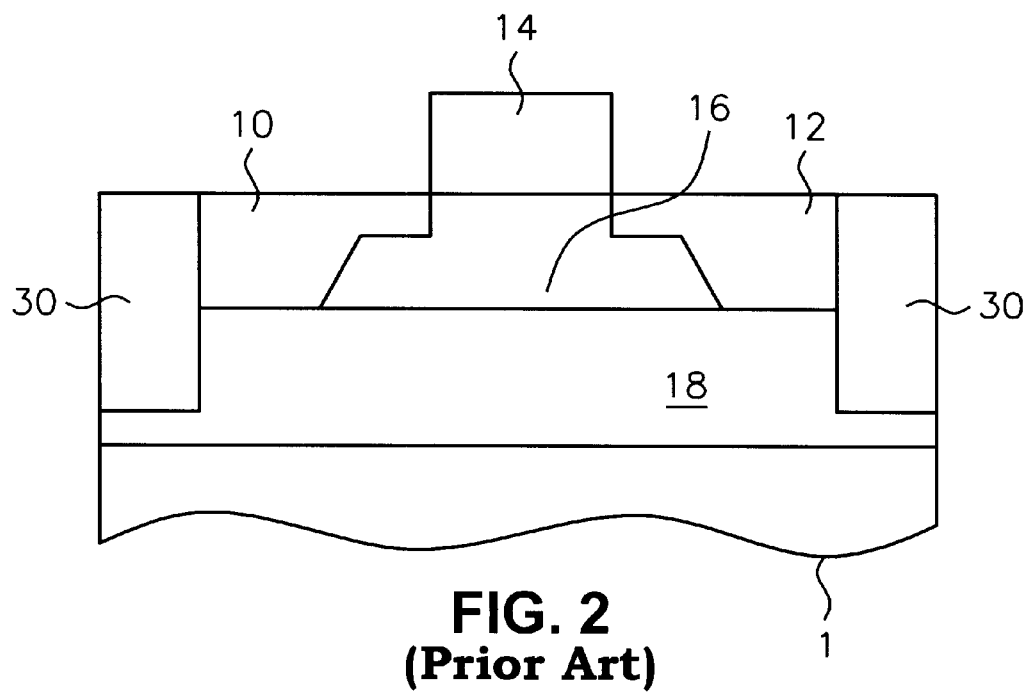
FIG. 2 shows in schematic representation a field effect transistor (FET) in a silicon-on-insulator (SOI) substrate.
Figure 3:
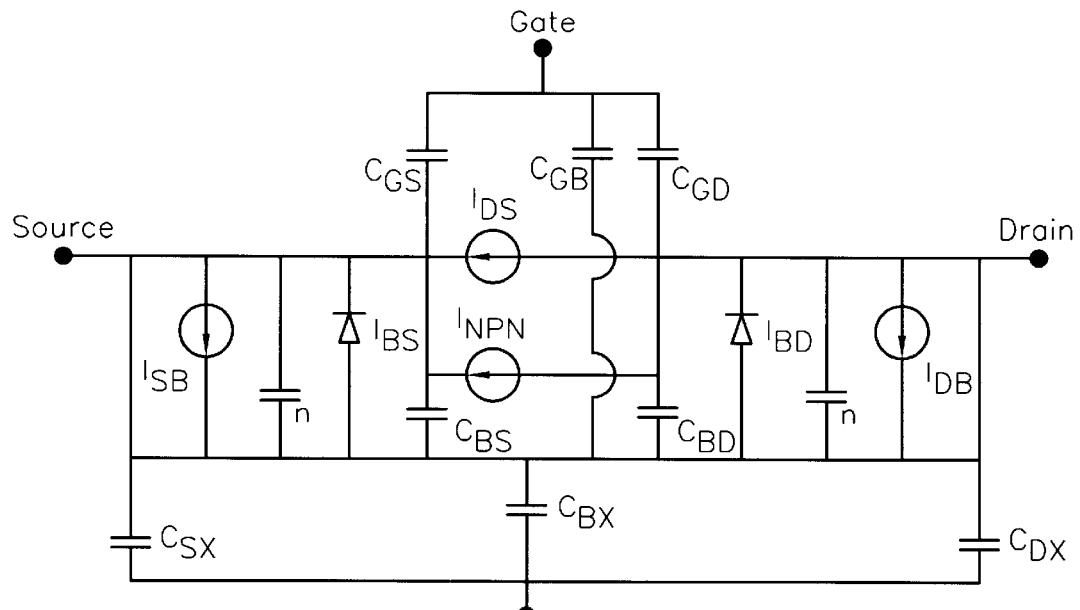
FIG. 3 shows in schema tic representation a capacitance-based model of a field effect transistor (FET) in a silicon-on-insulator (SOI) substrate.

In a first embodiment, DC convergence can be achieved by reducing the capacitive and charge element currents into the floating body region. When using a capacitance based model, such as that illustrated in FIG. 3, the current (I) into the floating body region is reduced to obtain a desired current value by decreasing the value of the capacitance (C) during the DC phase. It is known that the current (I) into the charge elements during the DC analysis is equal to the capacitance (C) times the change in voltage ($\Delta V$) divided by the pseudo-time step ($\Delta t$), I=C$\Delta V/\Delta t$. By reducing the value of the capacitance (C), the current (I), which is directly proportional to the capacitance, will also be reduced.

The value of the desired current can be determined by circuit designers using techniques well known in the art. As used herein, the desired current value refers to a current value which is tolerable under the requirements of the circuit.

The capacitance (C) can be reduced in the circuit simulation program by setting or modifying, for instance, a run control, parameter, or algorithm. Following the DC phase, the value of the capacitance (C) can be restored to its original value for later phases, such as a transient analysis phase. This approach is suitable for capacitance based model FET on an SOI substrate model, such as that illustrated in FIG. 3.

Figure 4:
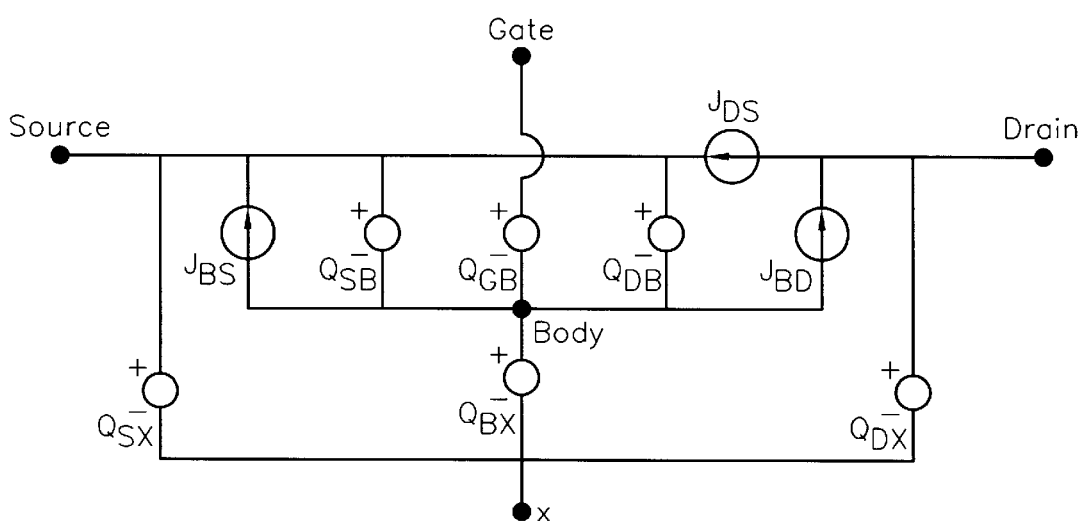
FIG. 4 shows in schematic representation a charge-based model of a field effect transistor (FET) in a silicon-on-insulator (SOI) substrate.
Figure 5:
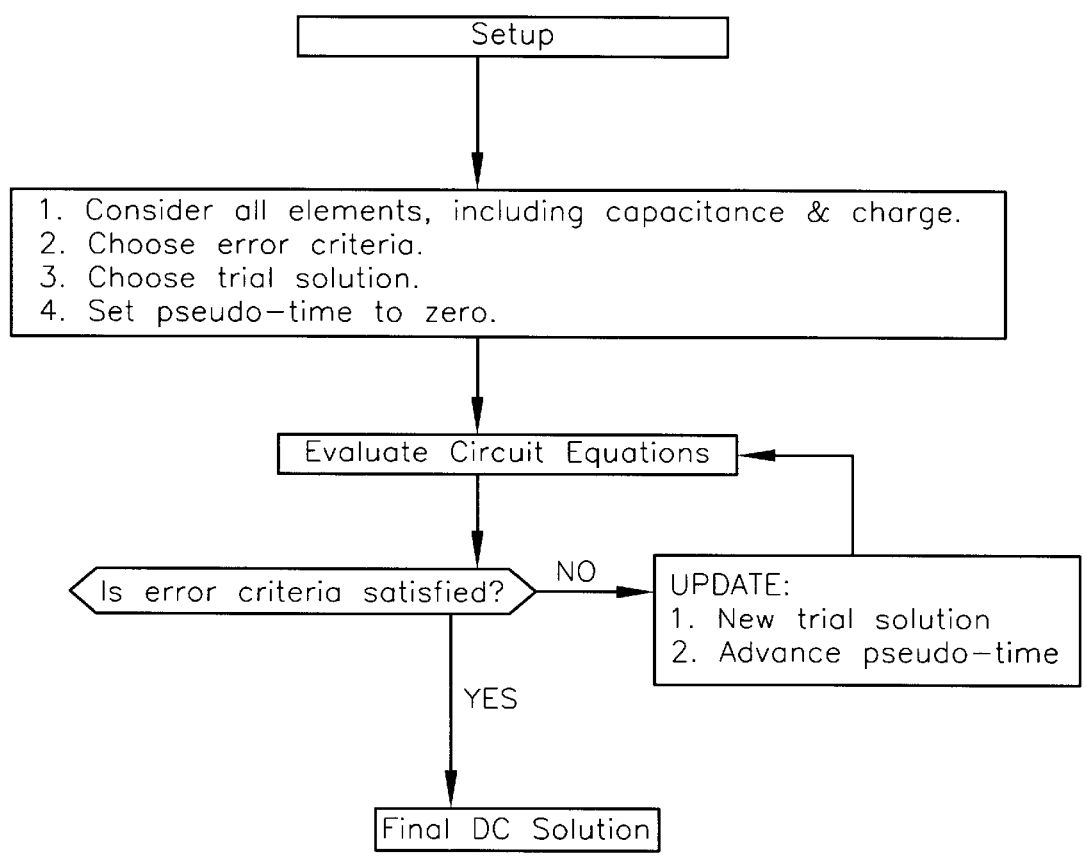
FIG. 5 shows a flow chart of a conventional DC simulation method.

In a similar manner, an accurate DC convergence can be achieved for a charge-based model, such as that illustrated in FIG. 4. It is commonly known that the current (I) is equal to the change in charge values ($\Delta Q$) divided by the change in pseudo-time ($\Delta t$), I=$\Delta Q/\Delta t$. By reducing the charge values, the current is also reduced to a sufficiently small value, herein referred to as the "desired current value" such that convergence can be achieved. This approach produces problems during subsequent analysis because when a charge element is restored to its natural value at the beginning of a latter phase, such as a transient analysis, a large current flows from the charge element due to its instant change in value, disrupting analysis. However, this could be fixed by, for instance, modifying an algorithm in the circuit analysis program to treat the charge element differently than other elements.

Figure 6:
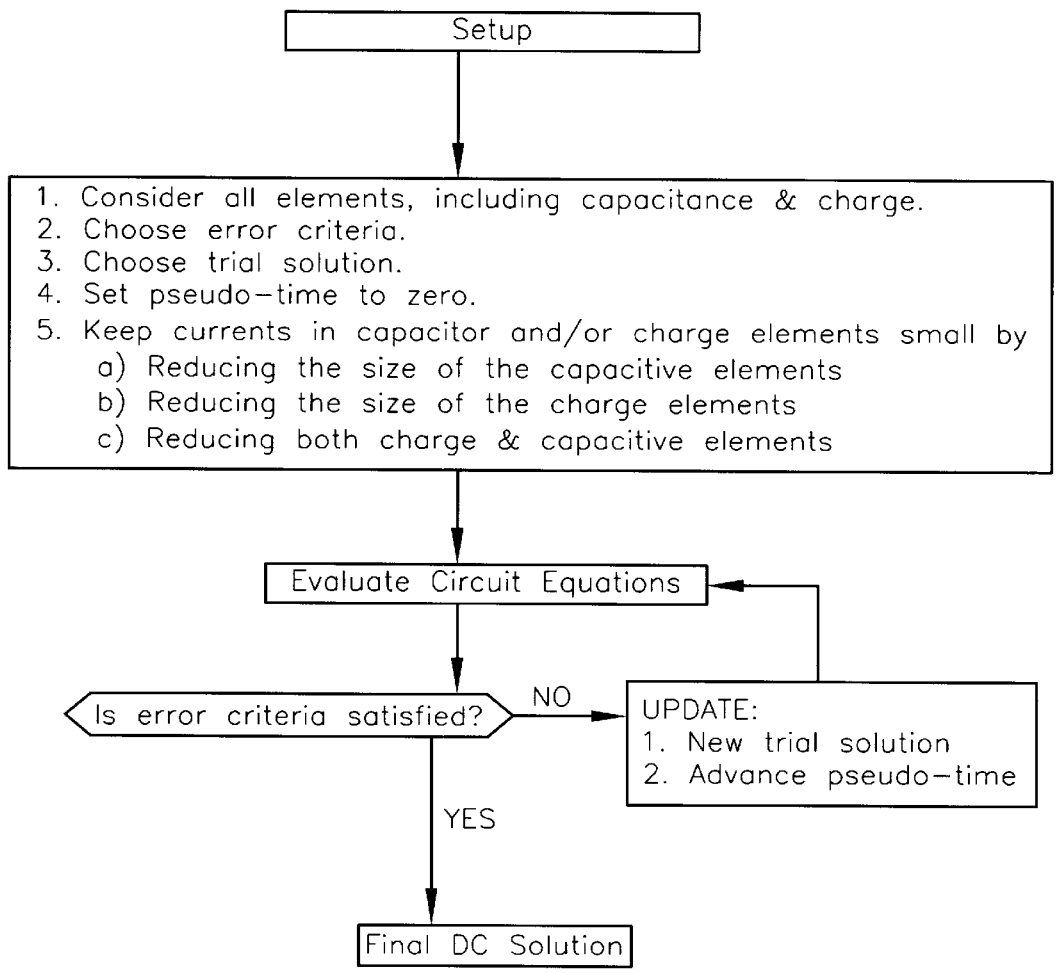
FIG. 6 shows a first flow chart for DC simulation using the method of the present invention.

FIG. 6 is a flow chart for DC simulation using the method as described above.

In a second preferred approach, the current can be reduced to a desired current value by increasing the pseudo-time step ($\Delta t$). The current (I) flowing into the charge elements during the DC analysis is proportional to the change in the charge element ($\Delta Q$) divided by the pseudo-time step ($\Delta t$) of the DC analysis, $I=\Delta Q/\Delta t$. It has been discovered that by making the pseudo-time step ($\Delta t$) a sufficiently large value, the current (I) becomes small enough to achieve an accurate DC convergence without obtaining incorrect floating body voltages. This works for both capacitance-based models and for charge-based models since increasing the pseudo-time step ($\Delta t$) reduces both the capacitive current ($I=C\Delta V/\Delta t$) and the charge current ($I=\Delta Q/\Delta t$).

The change in charge (or voltage) is limited by the absolute and relative error criteria. The size of the time step is computed by internal algorithms within the simulator. During a normal DC run, the currents due to the charge elements or capacitors are too large. It is not practical to reduce these currents by reducing the error criteria since that would make the simulation times unrealistically long. However, these currents can be reduced by increasing the size of the pseudo-time step. By forcing the time step to be large at the end of the DC simulation, the value of the derivative is reduced, and the currents through the charge and capacitor elements become sufficiently small that they do not affect the DC solution. A proper robust DC convergence is then achieved.

Modifying the pseudo-time step ($\Delta t$) works for both capacitor-based models and charge-based models. A time step increase in a circuit simulation program can be achieved by setting a run control, parameter, error criteria, or altering an algorithm, depending on the type of circuit simulation program used. For instance, in the AS/X and PowerSPICE circuit simulation programs, the time step can be increased by modifying an algorithm and setting a run control.

Figure 7:
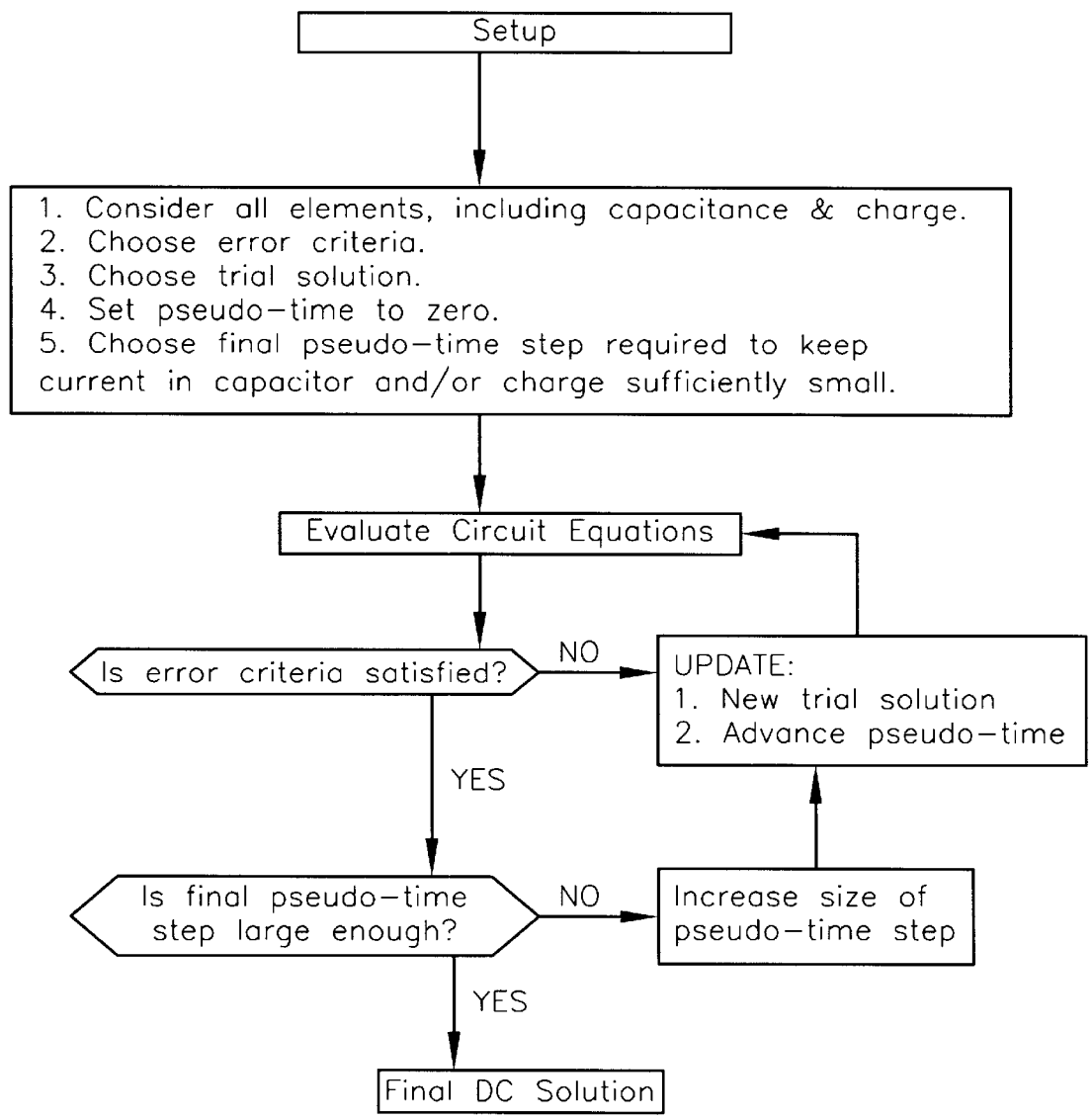
FIG. 7 shows a second flow chart for DC simulation using the method of the present invention.

FIG. 7 is a flow chart for the second approach to DC simulation using the method as described above.

EXAMPLE

The DC phase of the AS/X circuit simulation program was run with a charge-based model of an SOI FET. At convergence an absolute error ($\Delta Q$) of $5.0\times 10^{-4}$ pC was reached and the pseudo-time step ($\Delta t$) had increased to $1.0\times 10^6$ nsec. The resulting current (I), $I=\Delta Q/\Delta t$, was $5.0\times 10^{-10}$ mA. This value of current was not tolerable as it was too large compared to the small DC currents between the floating body, and the source and drain. An incorrect DC floating body voltage was obtained.

In accordance with this invention, an algorithm in the AS/X circuit analysis program was modified so that the pseudo-time step size at DC convergence is specified by the run control "Minimum DC final step size=$1.0\times 10^{12}$ nsec".

The charge element currents (I) were reduced to $5.0\times 10^{-16}$ mA. This value of current was sufficiently small that a correct value of the floating body voltage was obtained.

Although illustrated and described above with reference to specific embodiments, the present invention is nevertheless not intended to be limited to the details shown. Rather, various modifications may be made in the details within the scope and range of equivalents of the claims and without departing from the spirit of the invention.

What is claimed is:

1. A process for obtaining DC convergence in a DC phase of a circuit simulation program using a capacitive element based-model of field effect transistors (FETS) having floating body regions on a silicon-on-insulator (SOI) substrate, the process comprising:

selecting a desired current value;

reducing a magnitude of said capacitive elements connected to said floating body regions of said field effect transistors (FETs) on said silicon-on-insulator (SOI) substrate model during said DC phase; and running the DC phase of said circuit simulation program such that said desired current value is achieved.

2. The process of claim 1 wherein each of said field effect transistors (FETs) has a body region that is electrically insulated from said substrate.

3. The process of claim 1 wherein said circuit simulation program is AS/X.

4. The process of claim 1 wherein said circuit simulation program is PowerSPICE.

5. The process of claim 1 wherein said magnitude of the capacitive elements is restored after said DC phase.

6. A process for obtaining DC convergence in a DC phase of a circuit simulation program using a charge element based-model of field effect transistors (FETS) having floating body regions on a silicon-on-insulator (SOI) substrate, the process comprising:

setting a desired current value;

reducing a magnitude of said charge elements connected to said floating body regions of said field effect transistors (FETs) on said silicon-on-insulator (SOI) substrate model during said DC phase; and running the DC phase of said circuit simulation program such that said desired current value is achieved.

7. The process of claim 6 wherein each of said field effect transistors (FETs) has a body region that is electrically insulated from said substrate.

8. The process of claim 6 wherein said circuit simulation program is AS/X.

9. The process of claim 6 wherein said circuit simulation program is PowerSPICE.

10. The process of claim 6 wherein said magnitude of the charge elements is restored after said DC phase.

11. A process for obtaining DC convergence in a DC phase of a circuit simulation program using a charge and capacitive element based-model of field effect transistors (FETs) having floating body regions on a silicon-on-insulator (SOI) substrate, the process comprising:

setting a desired current value;

reducing a magnitude of said capacitive and charge elements connected to said floating body regions of said field effect transistors (FETs) on said silicon-on-insulator (SOI) substrate model during said DC phase; and running the DC phase of said circuit simulation program such that said desired current value is achieved.

12. The process of claim 11 wherein each of said field effect transistors (FETs) has a body region that is electrically insulated from said substrate.

13. The process of claim 11 wherein said circuit simulation program is AS/X.

14. The process of claim 11 wherein said circuit simulation program is PowerSPICE.

15. The process of claim 11 wherein said magnitude of the capacitive and charge elements are restored after said DC phase.

* * * * *